United States Patent [19]

Steigerwald

[11] Patent Number: 4,581,542
[45] Date of Patent: Apr. 8, 1986

[54] DRIVER CIRCUITS FOR EMITTER SWITCH GATE TURN-OFF SCR DEVICES

[75] Inventor: Robert L. Steigerwald, Scotia, N.Y.

[73] Assignee: General Electric Company, Schenectady, N.Y.

[21] Appl. No.: 551,629

[22] Filed: Nov. 14, 1983

[51] Int. Cl.[4] .......................................... H03K 17/72
[52] U.S. Cl. ................................ 307/252 C; 307/305
[58] Field of Search ........... 307/252 C, 252 J, 252 M, 307/305; 357/38

[56] References Cited

U.S. PATENT DOCUMENTS

| | | | |
|---|---|---|---|
| 3,466,467 | 9/1969 | Houcke et al. ...................... | 307/305 |
| 3,614,474 | 10/1971 | Hahn .................................... | 307/305 |
| 3,619,652 | 11/1971 | Ogle ..................................... | 307/305 |
| 4,160,920 | 7/1979 | Courier de Méré ........... | 307/252 C |

OTHER PUBLICATIONS

Wirth, IEEE Industrial Application Society Conference Record, pp. 788-793, "The Gate Turn-Off Thyristor in the Cascode Configuration".

Chen et al., IEEE Power Electronics Specialyts Conference 1981, pp. 252-257, "Application of Transistor Emitter-Open Turn-Off Scheme to High Voltage Power Inverters".

*Primary Examiner*—John Zazworsky
*Attorney, Agent, or Firm*—Mark L. Mollon; James C. Davis, Jr.; Marvin Snyder

[57] ABSTRACT

A bipolar emitter switching transistor in an emitter switched gate turn-off thyristor (GTO) arrangement has a controllable switching device coupled between the base of the emitter switching transistor and the anode of the GTO so that base current needed for the bipolar emitter switching transistor, to obtain a low collector-emitter voltage drop during transistor conduction, is derived from the load circuit, resulting in a greatly reduced base drive power supply requirement.

20 Claims, 6 Drawing Figures

4,581,542

DRIVER CIRCUITS FOR EMITTER SWITCH GATE TURN-OFF SCR DEVICES

BACKGROUND OF THE INVENTION

This invention relates to driver circuits for emitter switched gate turn-off silicon controlled rectifier (SCR) devices.

The turn-off characteristics of a gate controlled switch is one of the main considerations in the design of a power electronics circuit. It affects not only the circuit efficiency but also system reliability. The turn-off characteristics of a transistor depend not only on the transistor itself but also on the turn-off scheme used. Conventionally, a bipolar power transistor is turned off by reverse biasing the base-emitter junction. In general, the larger the reverse base current is, the faster the transistor turns off. However, danger may arise in the turn-off of an inductive load (such as an AC-DC inverter supplying a motor), in that the transistor may suddenly lose voltage blocking capability due to second breakdown. This in turn usually leads to the destruction of the transistor.

A turn-off scheme referred to as emitter-open or emitter switched turn-off in which the main power transistor is in series with a low voltage high speed transistor and the turn-off of the main power transistor is accomplished by opening the main power transistor emitter terminal circuit, i.e. turning off the low voltage high speed transistor, provides superior transistor turn-off characteristics as compared with conventional reverse-biased turn-off.

As pointed out by William F. Wirth in his IEEE Industrial Applications Society, Conference Record paper at pages 788-793 entitled "The Gate Turn-off Thyristor In the Cascode Configuration" delivered at the 1983 Annual Meeting, using the emitter open or cascode connection of a bipolar transistor at bus voltages over 600 volts begins to reveal some of limitations of the bipolar transistor; namely poor forward biased safe operating area, low gain, and deficiencies in the current carrying capabilities of metallization and wire bonds in the base area and speed up diode. The gate turn-off thyristor (GTO) is a good candidate to overcome these difficulties because it is similar in many ways to the bipolar transistor but has a number of advantages inherent in a four layer device that prove useful in high voltage (greater than 600 volt) applications.

The low voltage, high speed bipolar transistor used in an emitter switched gate turn-off SCR device configuration requires significant base drive to obtain low collector-emitter voltage drop when the bipolar transistor is biased into conduction. The base drive current is normally supplied by a dedicated floating power supply which adds circuit complexity and cost to present emitter switched gate turn-off drives.

It is an object of the present invention to substantially reduce the base drive current supplied by the power supply in emitter switched gate turn-off drivers.

It is another object of the present invention to reduce the required number of capacitors and eliminate all inductors in an emitter switched gate driver circuit so that the circuit is suitable for hybrid circuit/power module implementation.

SUMMARY OF THE INVENTION

In one aspect of the present invention a drive circuit for a transistor driven emitter switch including a gate turn-off thyristor (GTO) in series with a bipolar emitter switching transistor comprises a controllable switch means coupled between the base of the emitter switching transistor and the anode of the GTO for biasing the emitter switching transistor into conduction and maintaining the emitter switching transistor in a conductive state when the controllable switch means is conducting. Means for biasing the GTO into conduction are coupled to the gate of the GTO. Means for biasing the emitter switching transistor out of conduction are coupled across the base emitter terminals of the emitter switching transistor. Clamp means are provided for clamping the gate of the GTO to a predetermined voltage sufficiently low to protect the emitter switching transistor when the emitter switched transistor is biased out of conduction and sufficiently high to avoid shunting any of the GTO gate current through the clamp means when the GTO is conducting.

BRIEF DESCRIPTION OF THE DRAWING

While the specification concludes with claims particularly pointing out and distinctly claiming the present invention, the objects and advantages can be more readily ascertained from the following description of the preferred embodiment when used in conjunction with the accompanying drawing in which:

DETAILED DESCRIPTION OF THE INVENTION

Figure 1:
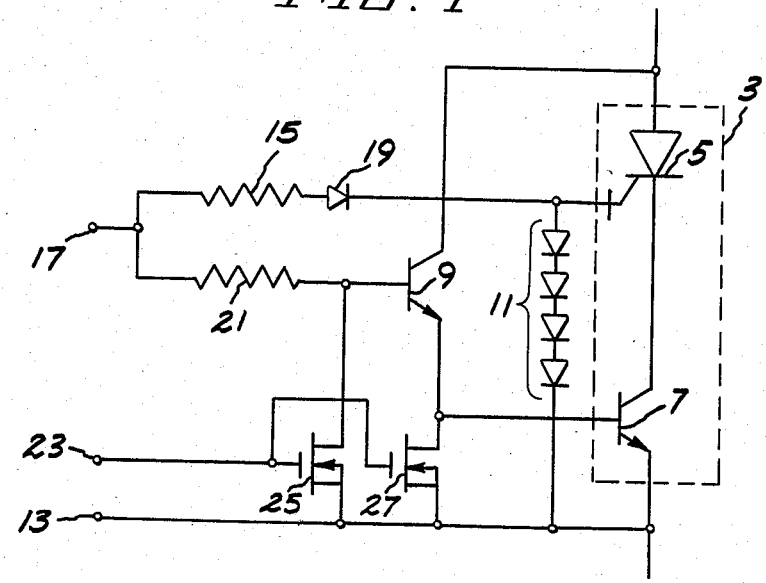
FIG. 1 is a schematic representation of a driver circiut for an emitter switched gate turn-off thyristor (GTO) with a bipolar transistor driving the emitter switching transistor in accordance with the present invention.

Referring now to the drawings in which like numerals indicate like elements throughout, and particularly FIG. 1 thereof, a driver circuit for a gate turn off silicon controlled rectifier or thyristor (GTO) 5 in series with an NPN bipolar low voltage (20-40 volts, typically), high current transistor 7 is shown. This series circuit 3 is herein designated an emitter switched GTO, or power switch. The emitter or cathode of GTO 5 is coupled to the collector of transistor 7. The emitter switched GTO 3 can be used as a single power device when high voltages (greater than 600 volts) need to be rapidly switched such as in ac to dc power inverters. A driver circuit comprises a high voltage bipolar transistor 9, such as a bipolar TV sweep transistor for switching the emitter switching transistor 7.

The collector of transistor 9 is coupled to the anode of GTO 5 and the emitter of transistor 9 is coupled to the base of transistor 7. A string of diodes 11, conveniently comprising 4 diodes, is connected to the gate of GTO 5 and negative reference terminal 13 to provide a clamp for the collector voltage of transistor 7. The anode of the diode string is coupled to the gate of GTO 5 and the cathode of the diode string to the negative reference terminal 13. A current limiting resistor 15 is coupled to a pulse receiving terminal 17 on one end and the anode of a diode 19 on the other. The diode 19 has its cathode coupled to the gate of GTO 5. Another current limiting resistor 21 has one end connected to pulse receiving terminal 17 and the other end coupled to the base of transistor 9. A second pulse receiving terminal 23 is coupled to the gate of an N channel metal-oxide-semiconductor field effect power transistor (MOSFET) 25 and the gate of an N channel MOSFET 27. The drain of the MOSFET 25 is coupled to the base of transistor 9. The source of MOSFET 25 is coupled to the reference terminal 13 and the emitter of transistor 7. The drain of MOSFET 27 is coupled to the base of transistor 7 and the source of MOSFET 27 is coupled to the reference terminal 13.

The operation of the circuit of FIG. 1 will now be described. The power switch 3 is assumed to be part of a larger circuit switching a high voltage. The power switch is turned on by supplying current to the gate of GTO 5 and biasing transistor 7 into conduction. Power supplied at terminal 17 in the form of a turn on pulse present when the power switch is to be on supplies gate current through resistor 15 to the gate of GTO 5 and base current through resistor 21 to the base of transistor 9 biasing transistor 9 into conduction. Transistor 9 then biases transistor 7 into conduction by supplying base current to transistor 7 from the anode circuit of GTO 5 (i.e., from the high voltage being switched). In this manner only a relatively small amount of current need be applied to the gate of GTO 5 to turn on and hold on the power switch 3. Transistor 9 and transistor 7 are not in a true Darlington configuration since their collectors are not directly connected to one another. Transistor 7 can be driven deeply into saturation because its collector voltage can drop below the collector voltage of transistor 9 by the forward voltage drop of GTO 5. Thus, a relatively low voltage drop can be achieved across the power switch.

To turn the emitter switched power device off, the gate current supplied to GTO 5 is interrupted by stopping the pulse supplied to terminal 17 and simultaneously providing a pulse to terminal 23. Pulses supplied to terminals 17 and 23 are supplied in a complementary fashion. The voltage at the gates of the two MOSFETs biases the two MOSFETS into conduction. The conduction of the two MOSFETS places a low impedance path between the bases of bipolar transistors 7 and 9 and reference terminal 13, causing reverse base current to flow, biasing transistor 9 and transistor 7 out of conduction. With transistor 7 off, the total anode current of GTO 5 is forced to flow out of the GTO gate and GTO 5 turns off with a turn-off gain of unity. Turn-off gain is defined as the magnitude of the current to be turned off divided by the magnitude of reverse gate current used to turn off the GTO. A turn off gain of unity results in a rapid GTO turn-off and therefore low switching loss. The anode current which flows out of the GTO gate during turn off momentarily flows through the four clamping diodes 11. Diode 19 prevents reverse gate current from flowing to terminal 17. The gate voltage is thereby clamped at a level equal to the voltage drop across diodes 11, which in turn clamps the collector voltage of transistor 7 to a low voltage level (approximately 20 to 30 volts). Transistor 7 can therefore be selected to be a low voltage device optimized for low forward drop. Transistor 9 introduces no turn-off switching loss since GTO 5 is still in its storage time (not yet blocking current) when transistor 9 turns off and thereby has negligible voltage applied to it at turn off.

Figure 2:
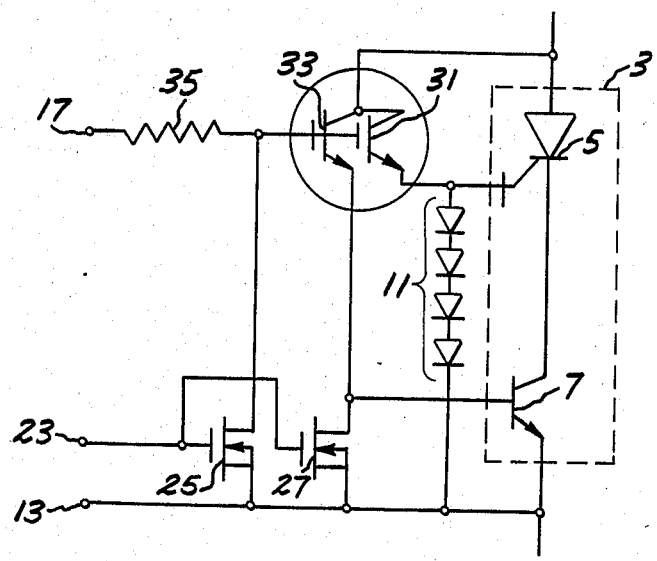
FIG. 2 is a schematic representation of a driver circuit for an emitter switched GTO with an insulated gate transistor driving the emitter switching transistor in accordance with the present invention.

Referring now to FIG. 2 an insulated gate transistor (IGT) driven emitter switched GTO 3 is shown. IGT's are a new type of metal-oxide semiconductor gate turn on/off power switching device in which the advantages of power MOSFETS and bipolar transistors are combined. The device has the high input impedance of MOSFETS and low on-state conduction losses similar to bipolar transistors. The devices are available, for example, from the General Electric Company. Emitter switched GTO 3 is shown as the same type as in the circuit of FIG. 1. A driver circuit comprises two IGTs 31 and 33, respectively, for biasing the GTO 5 and transistor 7 into conduction, respectively, the IGTs being shown as being in a single package. The collectors of the two IGTs are coupled to one another and to the anode of GTO 5. The emitter of IGT 33 is connected to the base of transistor 7 and the emitter of IGT 31 is coupled to the gate of GTO 5. A string of diodes 11 having 4 diodes is coupled between the gate of GTO 5 and a reference terminal 13 to provide a clamp for the collector voltage of transistor 7. The anode of the diode string is coupled to the gate of GTO 5 and the cathode of the diode string is coupled to the reference terminal 13. A current limiting resistor 35 is coupled between a pulse receiving terminal 17 and both gates of IGTs 31 and 33, respectively. A pulse receiving terminal 23 is coupled to the gate of n channel MOSFET 25 and to the gate of n channel MOSFET 27. The drain of MOSFET 27 is coupled to the base of transistor 7 and the source of MOSFET 27 is coupled to the emitter of transistor 7 and reference terminal 13. The drain of MOSFET 25 is coupled to the gates of IGTs 31 and 33, and the source of MOSFET 25 is coupled to the reference terminal 13.

In the circuit of FIG. 2, the double emitter IGT device is biased into conduction when a positive voltage is applied at terminal 17. A small amount of GTO gate drive power is applied continuously from terminal 17 to insure that the GTO remains latched on for slowly rising anode currents which are common in six-step inverters and many PWM circuits where the power device 3 is likely to be used as a switch.

IGT 31 supplies gate current to GTO 5 from the anode circuit of GTO 5 and IGT 33 supplies base current to transistor 7 from the anode circuit of GTO 5. The relative emitter area of the IGT emitters determine the relative amount of current delivered to the GTO gate and the transistor base. Turn-off occurs, as in the circuit of FIG. 1, with power removed from terminal 17 and applied to terminal 23 interrupting current flow to the gate of GTO 5. MOSFET 25 biases IGTs 33 and 31 out of conduction. MOSFET 27 biases transistor 7 out of conduction. Anode current of GTO 5 is diverted to the gate with the diode string conducting momentarily to provide clamping.

IGT 31 introduces no turn-off switching loss since GTO 5 is in its storage time when IGT 31 is biased out of conduction and therefore negligible voltage is applied to IGT 31 at turn-off.

Figure 3:
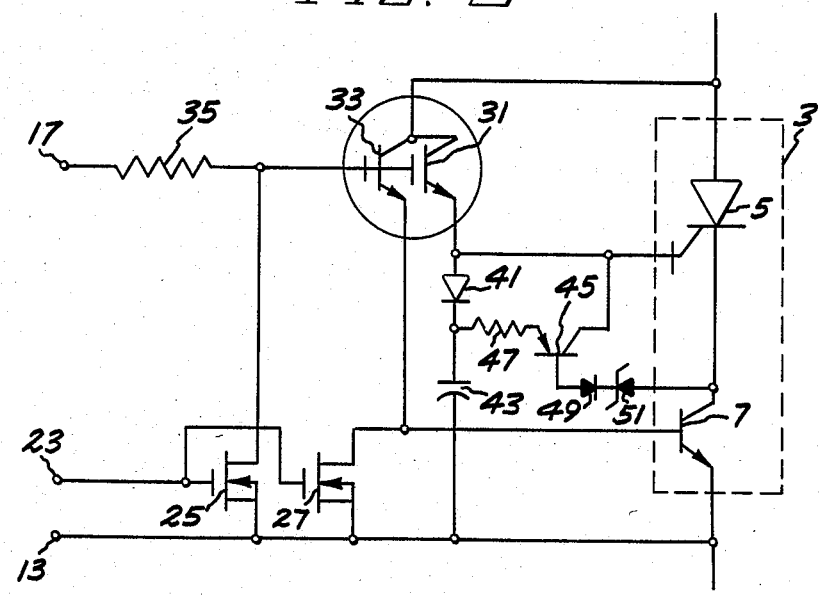
FIG. 3 is a schematic representation of a drive circuit for an emitter switched GTO with a capacitive clamp for the GTO in accordance with the present invention.

In FIG. 3, an IGT driven emitter switched GTO configured similarly to the circuit of FIG. 2 in which like elements bear like reference numerals, except that instead of a string of diodes serving to clamp the collector voltage of transistor 7, a clamp circuit which supplies energy to the gate circuit for GTO turn-on is connected to emitter switched GTO 3 and comprises a diode 41 having its anode coupled to the gate of GTO 5 and its cathode coupled to one end of a clamp capacitor 43. The other end of clamp capacitor 43 is coupled to reference terminal 13. A bipolar transistor 45 has its emitter coupled through a current limiting resistor 47 to the junction between diode 41 and capacitor 43. The collector of transistor 45 is connected to the gate of GTO 5. A diode 49 which protects transistor 45 during turn-off has its anode connected to the base of transistor 45 and its cathode coupled to the cathode of zener diode 51. The anode of zener diode 51 is coupled to the junction between the cathode of GTO 5 and the collector of transistor 7 to maintain a minimum voltage on the clamp capacitor.

Figure 4:
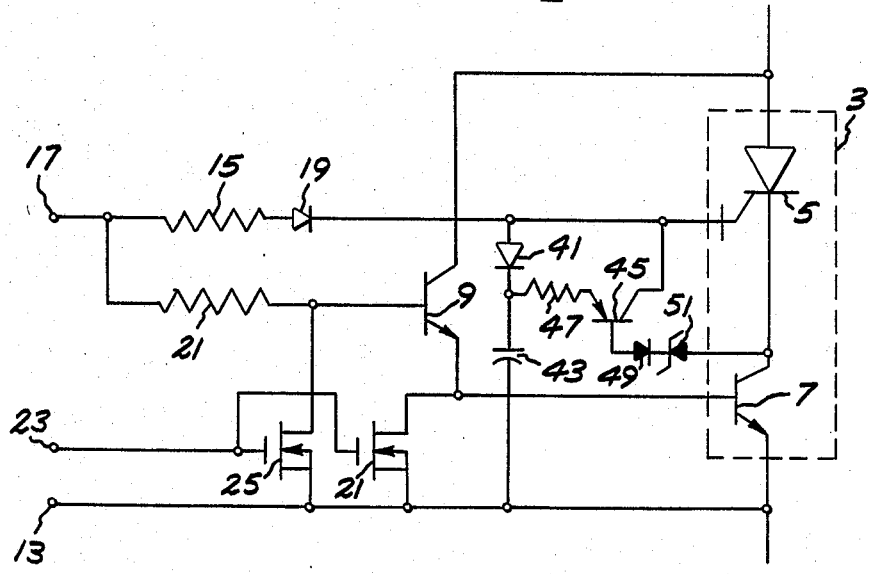
FIG. 4 is a schematic representation of another embodiment of a driver circuit for an emitter switched GTO with a capacitive clamp for the GTO in accordance with the present invention.

FIG. 4 shows a bipolar driven emitter switched GTO with a capacitive clamp, and is configured similarly to the circuit of FIG. 1 wherein like elements bear like reference numerals, except that instead of diode string 11 a clamp circuit which supplies energy to the gate circuit for GTO turn-on is connected to the emitter switched GTO 3 and is configured similarly to the clamp circuit shown in FIG. 3. The elements of the clamp circuit of FIG. 4 are connected as in FIG. 3 to the gate of GTO 5, the junction of GTO 5 and transistor 7, and the reference terminal 13.

FIGS. 3 and 4 employ capacitive gate clamps for GTO 5 in the circuits of FIGS. 1 and 2, respectively. As the GTO 5 is being turned off, diverted anode current flows through diode 41, charging capacitor 43. The maximum charge on capacitor 43 may be controlled by the selection of the size of capacitor 43. When GTO 5 and transistor 7 are subsequently turned on, transistor 45 is biased into conduction, providing a discharge path for capacitor 43 through the gate of GTO 5 and through transistor 7. Zener diode 51 assures that the capacitor does not discharge below a predetermined voltage so that forward gate current supplied to turn the GTO on is not diverted from the GTO to the capacitor. This is achieved by rendering the base circuit for transistor 45 nonconductive when the base to emitter voltage drops below a predetermined level.

Figure 5:
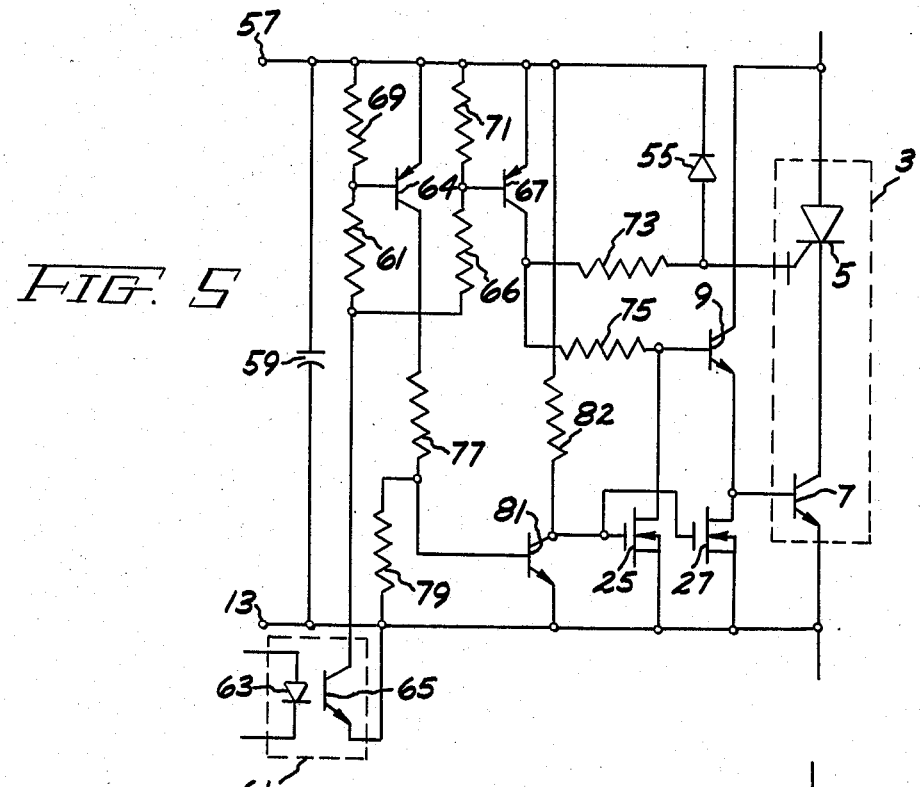
FIG. 5 is a schematic representation of an isolated driver circuit for an emitter switched GTO in accordance with the present invention.

FIG. 5 shows an isolated drive for a bipolar driven GTO emitter switch 3. A driver circuit comprises a transistor 9 having its collector coupled to the anode of GTO 5 and its emitter coupled to the base of transistor 7. A diode 55 has its anode coupled to the gate of GTO 5 and its cathode connected to a terminal 57. Coupled between terminal 57 and reference terminal 13 is a clamp capacitor 59. An external dc power source (not shown) typically 5-15 volts, supplies power to terminals 13 and 57. An opto-isolator 61 including a light emitting diode 63 and a photo-transistor 65 receiving optical control pulses from the diode 63 in response to electrical pulses provided to the diode from a source (not shown). The collector of photo-transistor 65 is coupled through biasing resistor 61 to the base of pulse bipolar transistor 64. The base of transistor 64 is coupled to terminal 57 through biasing resistor 69 and the base of transistor 67 is coupled to terminal 57 through biasing resistor 71. A resistor 66 couples the base of transistor 67 to the collector of photo-transistor 65. The emitter of transistor 63 is coupled to terminal 57 as is the emitter of transistor 67. A current limiting resistor 73 couples the gate of GTO to the collector of transistor 67. A current limiting resistor 75 couples the base of transistor 9 to the collector of transistor 67. The series combination of biasing resistors 77 and 79 couples the collector of transistor 64 to the reference terminal 13. The emitter of photo-transistor 65 is coupled to reference terminal 13. A bipolar transistor 81 has its base coupled to the junction of resistors 77 and 79 and its emitter coupled to reference terminal 13. The collector of transistor 81 is coupled through bias resistor 82 to terminal 57. An n channel MOSFET 25 has its gate coupled to the gate of an n channel MOSFET 27. The gate of MOSFET 25 is coupled to the collector of transistor 81. The sources of MOSFETs 25 and 27 are each connected to reference terminal 13. The drain of MOSFET 25 is coupled to the base of transistor 9 and the drain of MOSFET 27 is coupled to the base of transistor 7.

Isolated gate drive 61 employs opto-isolation to couple the logic level signals from a controller (not shown) to the power circuitry. A small isolation transformer and rectifier can be used to provide input power between terminals 57 and 13. To turn on the power switch 3 a logic level signal is supplied to the opto-isolator 61 by energizing diode 63, causing photo-transistor 65 to provide a conductive path for series-connected resistors 69 and 61, and 71 and 65, thereby biasing transistors 63 and 67 into conduction. Transistor 63, upon being rendered conductive, biases transistor 81 into conduction which in turn keeps transistors 25 and 27 nonconductive. Transistor 67, upon being rendered conductive, biases transistor 9 into conduction which in turn biases transistor 7 into conduction. Transistor 67 also provides gate current to the GTO 5 from the isolated power supply (not shown) connected to terminals 57 and 23.

During turn off, which occurs when the logic level signal is removed from opto-isolator 61, transistors 63, 67, 81, 9 and 7 are biased out of conduction, and MOSFETs 25 and 27 are based into conduction through biasing resistor 82, causing transistors 9 and 7 to be biased out of conduction, respectively. When emitter switching transistor 9 is biased out of conduction, transistor 7 is rendered nonconductive, causing anode current from GTO 5 to be diverted through the GTO 5 gate and GTO gate charging capacitor 59. The gate of the GTO 5 is clamped through diode 55 to the external power supply voltage (not shown) connected across terminals 57 and 13. Because power is delivered to the external power supply by the GTO gate at turn-off, only the difference between that power and the required gate power need be supplied by the external power supply allowing a smaller power supply to be used.

Figure 6:
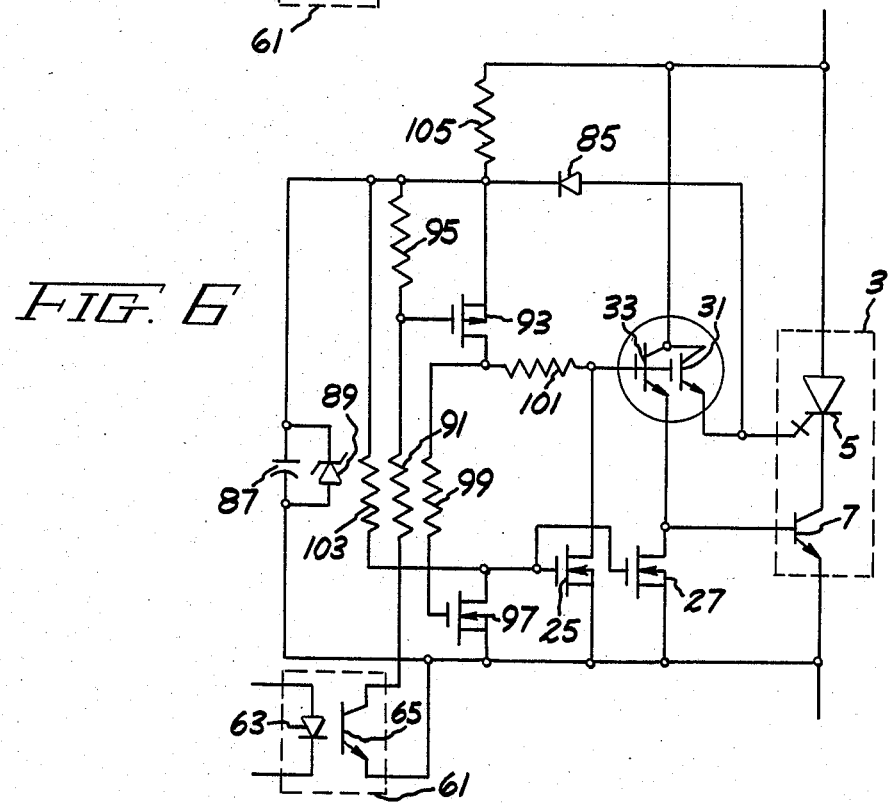
FIG. 6 is a schematic representation of another embodiment of an isolated driver circuit in accordance with the present invention.

Referring now to FIG. 6 an isolated drive for an IGT driven GTO emitter switch is shown. An emitter switched GTO 3 of the same type as in FIG. 1 is used. A driver circuit comprises two IGT transistors 31 and 33, respectively, for biasing the GTO 5 and transistor 7 into conduction, respectively, the IGT's shown as being in a single package. The collectors of the two IGTs are coupled to one another and to the anode of GTO 5. The emitter of IGT 33 is connected to the base of transistor 7 and the emitter of IGT 31 is coupled to the gate of GTO 5. The gate of GTO 5 is coupled through a forward-connected diode 85 to one side of a capacitor 87.

The other side of capacitor 87 is coupled to the emitter of transistor 7. A zener diode 89 is connected in series opposition with diode 85 and in parallel with capacitor 87 to limit the capacitor voltage. An opto-isolator 61 receives electrical control pulses from a source (not shown) across a light emitting diode 63 optically coupled to phototransistor 65. One of the output terminals of the opto-isolator 61 is coupled to the emitter of transistor 7 and the other terminal is coupled through a current limiting resistor 91 to the gate of a p-channel MOSFET 93. The gate of MOSFET 93 is connected to the cathode of a diode 85 through a biasing resistor 95. An n channel MOSFET 97 has its gate connected through a pull up resistor 99 to the drain of MOSFET 93. A current limiting resistor 101 couples the drain of MOSFET 93 to the gate of an IGT 33. The gate of an n channel MOSFET 25 is coupled to the drain of MOSFET 97, the gate of a channel MOSFET 27, and through a pull up resistor 103 to the cathode of diode 85. The sources of MOSFET 25 and 27 are each coupled to the emitter of transistor 7. The drain of MOSFET 25 is coupled to the gate of IGT 33. The drain of MOSFET 27 is coupled to the base of transistor 7.

Opto-isolator 61 couples the logic level drive circuitry (not shown) to the power circuitry. To turn-on the power switch 3, power is supplied to the opto-isolator, biasing MOSFET 93 into conduction. MOSFET 93 in turn biases MOSFET 97 into conduction which keeps MOSFETS 25 and 27 nonconductive. Upon becoming conductive, MOSFET 93 also biases IGTs 31 and 33 into conduction. IGT 33 in turn biases transistor 7 into conduction and IGT 31 provides gate current to GTO 5 from the GTO anode circuit.

To turn off the power switch 3, power is removed from opto-isolator 61 by deenergizing light emitting diode 63. As a result, MOSFETs 93 and 97, IGTs 33 and 31 and transistor 7 are biased out of conduction, while MOSFETs 25 and 27 are biased into conduction. Anode current from GTO 5 is diverted out the gate terminal of the GTO through diode 85 to charge capacitor 87. Zener diode 89, limits the capacitor charge to a predetermined zener voltage (10 volts for example). Negligible drive power is required from the capacitor 87 to drive MOSFETs 25, 93 and 97. The power supplied to the capacitor by reverse gate current from GTO 5 when transistor 7 is turned off can be sufficient to supply the entire gate drive power for the circuit. Because the drive power requirement is so low, power to charge capacitor 87 may also be obtained from the anode circuit through dropping resistor 105. The low power requirement limits losses in the dropping resistor.

The foregoing describes driver circuits for emitter switched gate turn-off SCR devices which eliminate the need for dedicated floating power supplies and eliminate many capacitors and all inductors so that the drive circuit is suitable for hybrid circuit (power module) implementation.

While the invention has been particularly shown and described with reference to several embodiments thereof, it will be understood by those skilled in the art that various changes in form or details may be made without departing from the spirit and scope of the invention.

What is claimed is:

1. A driver circuit for a transistor driven power switch including a gate turn-off thyristor (GTO) in series with a bipolar emitter switching transistor, said driver circuit comprising:

controllable switch means coupled between the base of the emitter switching transistor and the anode of the GTO, for biasing the emitter switching transistor into conduction and maintaining said emitter switching transistor in a conductive state when said controllable switch means is conducting;

turn-on means coupled to the gate of said GTO and to the base of said controllable switch means for providing a pulse to said gate to turn said GTO on and to said base to turn on said controllable switch means when said power switch is on;

bias means coupled across the base emitter terminals of said emitter switching transistor for biasing said emitter transistor out of conduction to turn said GTO off; and clamp means for clamping the gate of said GTO to a predetermined voltage sufficiently low to protect the emitter switching transistor when said emitter switching transistor is biased out of conduction and said GTO turns off.

2. The circuit of claim 1 wherein said means for biasing said emitter switching transistor out of conduction comprises a first MOSFET.

3. The circuit of claim 2 further comprising means coupled to said first MOSFET and to said controllable switch means for biasing said controllable switch means out of conduction when said emitter switching transistor is biased out of conduction.

4. The circuit of claim 3 wherein said means for biasing said controllable switch means out of conduction comprises a second MOSFET having its gate coupled to the gate of said first MOSFET and its drain electrode coupled to said controllable switch means.

5. The circuit of claim 1 wherein said controllable switch means comprises a semiconductor device having an insulated gate.

6. The circuit of claim 1 wherein said said controllable switch means comprises a bipolar transistor.

7. The circuit of claim 1 wherein said controllable switch means comprises an insulated gate transistor.

8. The circuit of claim 1 wherein said means for providing a gate pulse to said GTO comprises a controllable switch means coupling the anode of the GTO to the gate of said GTO.

9. The circuit of claim 1 wherein said clamp comprises means for storing gate turn-off energy and means for returning energy into the GTO gate.

10. The circuit of claim 9 wherein said means for storing gate turn-off energy and returning energy into the GTO gate comprises a diode and a capacitor coupled in series between the gate of the GTO and the emitter of the emitter switching transistor, said diode poled to conduct when reverse gate current is flowing to charge said capacitor.

11. The circuit of claim 9 wherein said means for storing gate turn-off energy and returning energy into the GTO gate comprises a zener diode, a bipolar transistor having a collector coupled to said GTO gate, an emitter coupled to the junction of said capacitor and diode and a base coupled through said zener diode to the junction between said GTO and emitter switching transistor, said zener diode poled to avoid completely discharging said capacitor when said bipolar transistor is biased into conduction by the conduction of the emitter switching transistor.

12. An isolated driver circuit for a transistor driven emitter switch including a gate turn-off thyristor (GTO)

in series with a bipolar emitter switching transistor, said driver circuit comprising:

first controllable switch means coupled between the base of the emitter switching transistor and the anode of the GTO, for biasing the emitter switching transistor into conduction and maintaining said emitter switching transistor in a conductive state when said controllable switch means is conducting;

second controllable switch means coupled across the base emitter terminals of said emitter switching transistor for biasing said emitter switching transistor out of conduction to turn off said GTO;

third controllable switch means coupled to said first controllable switch means for biasing said first controllable switch means out of conduction when said emitter switch means is biased out of conduction;

clamp means coupled to the gate of said GTO for clamping the gate of said GTO to a predetermined voltage sufficiently low to protect the emitter switched transistor when said emitter switched transistor is biased out of conduction and said GTO turns off, said clamp means coupled to an external power source;

isolated switch means coupled to an external control for biasing said first controllable switch into conduction when said isolated switch is energized;

fourth controllable switch means responsive to said isolated switch for providing a gate pulse to said GTO to turn said GTO on; and fifth controllable switch means responsive to said isolated switch and coupled to said second and third controllable switch means, said sixth controllable switch means preventing said second controllable switch means from biasing said emitter switching transistor out of conduction and preventing said third controllable switch means from biasing said first controllable switch means out of conduction only when said isolated switch means is conducting.

13. The driver circuit of claim 12 wherein each said first, fourth and fifth, controllable switch means, respectively, comprises a bipolar transistor and said second and third controllable switch means, respectively, comprises MOSFETs.

14. An isolated driver circuit for a transistor driven power switch including a gate turn-off thyristor (GTO) in series with a bipolar emitter switching transistor, said driver circuit comprising:

first controllable switch means coupled between the base of the emitter switching transistor and the anode of the GTO, for biasing the emitter switching transistor into conduction and maintaining said emitter switching transistor in a conductive state when said controllable switch means is conducting;

second controllable switch means coupled to the gate of said GTO for providing a gate pulse to said GTO to turn said GTO on;

third controllable switch means coupled across the base emitter terminals of said emitter switching transistor for biasing said emitter switching transistor out of conduction to turn said GTO off;

fourth controllable switch means coupled to said first controllable switch means for biasing said first controllable switch means out of conduction when said emitter switch means is biased out of conduction;

clamp means coupled to the gate of said GTO for clamping the gate of said GTO to a predetermined voltage sufficiently low to protect the emitter switched transistor when said emitter switched transistor is biased out of conduction and said GTO turns off;

an isolated switch;

fifth controllable switch means coupled to said first and second controllable switch means and responsive to said isolated switch for biasing said first and second controllable switch means into conduction for biasing said emitter switching transistor and said GTO into conduction; and sixth controllable switch means coupled to said fifth controllable switch means and responsive to said isolated switch for preventing said third controllable switch means from biasing said emitter switching transistor out of conduction and for preventing said fourth controllable switch means from biasing said first controllable switch means out of conduction only when said isolated switch is conducting.

15. The isolated driver circuit of claim 14 wherein said second controllable switch means for providing a gate pulse to said GTO couples the anode of said GTO to the gate of said GTO.

16. The isolated driver of claim 14 wherein said first and second controllable switch means each comprises an insulated gate transistor.

17. The isolated driver of claim 14 wherein each of said third, fourth, fifth and sixth controllable switch means, respectively, comprises a MOSFET.

18. The isolated driver of claim 14 wherein said clamp means comprises a capacitor coupled at one end through a diode to the gate of said GTO, said diode poled to conduct reverse GTO gate current to said capacitor, the other end of said capacitor coupled to the emitter of the emitter switching transistor.

19. The isolated driver of claim 18 wherein said clamp means further comprises a zener diode coupled in parallel with said capacitor to limit the capacitor voltage to a predetermined maximum.

20. The isolated driver of claim 18 wherein the junction between said diode and capacitor is coupled through a current limiting resistor to the anode of said GTO.

* * * * *